(12) United States Patent
Cheng

(10) Patent No.: US 6,501,259 B1
(45) Date of Patent: Dec. 31, 2002

(54) ANALOG PHASE FREQUENCY DETECTING APPARATUS AND METHOD

(75) Inventor: Ting-Yuan Cheng, Hsinchu (TW)

(73) Assignee: Industrial Technology Research Institute (TW)

( * ) Notice: Subject to any disclaimer, the term of this patent is extended or adjusted under 35 U.S.C. 154(b) by 22 days.

(21) Appl. No.: 09/695,834

(22) Filed: Oct. 26, 2000

(51) Int. Cl.[7] .......................... G01R 23/12; H04B 7/00
(52) U.S. Cl. .................................. 324/76.53; 455/260
(58) Field of Search .......................... 324/76.53, 76.23, 324/76.27, 76.82; 455/207, 180.3, 260

(56) References Cited

U.S. PATENT DOCUMENTS 5,917,315 A  *  6/1999  Weckstrom .............. 324/76.23

* cited by examiner

Primary Examiner—N. Le
Assistant Examiner—James Kerveros

(57) ABSTRACT

The analog phase frequency detecting apparatus includes the devices described below. The first frequency sensitive device is used to amplify a first input signal with a gain function, which changes responding to the frequency of the reference input signal. The transfer characteristic curve of the first frequency sensitive device includes a monotonous decrease (or increase) curve. The second frequency sensitive device is utilized to amplify an oscillating signal with the varying gain function responding to the frequency of the oscillating signal. The first and the second DC component extracting device is used to extract the direct current component of the first and the second amplified input signal. The comparing device is used to generate a frequency locking signal, in addition, the phase detecting device generates a phase locking signal when the phase of the reference input signal is equal to that of the oscillating signal. The loop filter generates a voltage level responding to the frequency locking signal and the phase locking signal. Then the voltage controlled oscillator generates the output signal that has the same frequency and constant phase relationship as that of the reference input signal responding to the frequency locking signal and the phase locking signal.

7 Claims, 8 Drawing Sheets

<Prior art>

<Prior art>

ANALOG PHASE FREQUENCY DETECTING APPARATUS AND METHOD

BACKGROUND OF THE INVENTION

1. Field of the Invention

This invention relates to analog phase frequency detecting apparatus, especially relates to an analog phase frequency detector that can rapidly lock the phase and frequency of the input signal.

2. Description of the Prior Art

The phase lock loop (PLL) is widely used in the high frequency circuit (especially in the communication system) to generate a signal that has the same frequency and phase as the input signal. In a PLL system (circuit), phase frequency detector is an important apparatus. It is used to detect the phase and frequency difference between the reference signal and the signal of voltage control oscillator (VCO). The block diagrams of prior art phase frequency detecting apparatus are shown in FIG. 1 and FIG. 2. In FIG. 1, It is a kind of digital phase frequency detector. In FIG. 2, It includes a phase detector and a switch.

In general, the phase frequency detecting apparatus is divided into two kinds digital and analog, the operational range of the digital phase frequency detecting apparatus is very large, so it is widely used in the frequency synthesizer. However, the digital phase frequency detector utilizes J-K flip flop (J-K FF) or tri-state phase frequency detector as a phase frequency detector. Since J-K flip flop (J-K FF) and tri-state phase frequency detector are digital circuits, their transistors will work in saturation or cut off region, and this will slow down the operation speed of the detector.

The other disadvantage of the digital phase frequency detector is illustrated below. If $f_{in}$ is the input frequency of the voltage control oscillator (VCO) and $f_{ref}$ is the input frequency of the reference input signal, which are both being input to the digital phase frequency detector. As $f_{in}$ is much greater (or smaller) than $f_{ref}$, i.e., $f_{in} \gg f_{ref}$, the output voltage level of the digital phase frequency detector is high (or low). In the other condition, if $f_{in}$ is only ten percents greater (or smaller) than $f_{ref}$, the output voltage level may continuously change between high voltage level and low voltage level.

Furthermore, in the digital phase frequency detector, because of the latch time of the flip-flop employed in the digital phase frequency detector, the operational speed of the digital phase frequency detector is confined, and the digital phase frequency detector can only operate in low speed.

As described above, the digital phase frequency detector can't be used in some cases. So a certain type of analog phase frequency detector is evolved, for example, the block diagrams of the traditional analog phase frequency detector is illustrated in FIG. 2.

Though the traditional analog phase frequency detector try to raise its operational speed, its operational speed can't be improved obviously. This is because strictly speaking it doesn't contain a frequency detector. By the way, it is necessary to further improve the operation current of the phase detector that employed in the analog phase frequency detector. Particularly, the traditional analog phase frequency detector just has only one chance to lock the VCO (voltage controlled oscillator), so the locking capability is poor. A block diagram example of the prior art analog phase frequency detector is illustrated in FIG. 2. Accordingly, it is obvious that it discharges the loop filter at the beginning of each locking period and then charging with a constant current, thus it needs greater locking time at the occasion of higher input signal frequency. Since the prior art analog phase frequency detector has some limitations resulted from its circuit architecture, it is necessary to improve the prior art analog phase frequency detector to obtain better performance.

SUMMARY OF THE INVENTION

Because the traditional analog phase frequency detector has its limitations, it is advantageous to use an analog phase frequency detector composed of analog elements to detect the phase and frequency of a reference input signal with minimum current level. The analog phase frequency detecting apparatus according to one preferred embodiment of the present invention can be used to detect (lock) the phase and frequency of the input signals. The analog phase frequency detecting apparatus includes the following devices: the first frequency sensitive device, the second frequency sensitive device, the first DC component extracting means, the second DC component extracting means, the hysteresis comparator, the comparator, the loop filter, the phase detector, and the voltage controlled oscillator.

The first frequency sensitive device is used to amplify the reference input signal with a varying gain function responding to frequency of the reference input signal. The magnitude of the varying gain function varies corresponding to frequency of the reference input signal. The transfer characteristic curve of the first frequency sensitive device includes a monotonous curve within a linear mapping frequency range, and the first frequency sensitive device processes the reference input signal to generate a first amplified input signal.

The second frequency sensitive device is used to amplify an voltage controlled oscillator signal with the varying gain function responding to frequency of the oscillating signal. Besides, the second frequency sensitive device and the first frequency sensitive device are of the same architecture. So, the transfer characteristic curve of the second frequency sensitive device is same as that of the first frequency sensitive device, and the second frequency sensitive device processes the oscillating signal to generate a second amplified input signal.

The first DC component extracting means is used to extract the DC component of the first amplified input signal, and the working frequency range of the first DC component extracting means includes the linear mapping frequency range. The second DC component extracting means is used to extract the DC component of the second amplified input signal, and the working frequency range of the second DC component extracting means includes the linear mapping frequency range. In addition, the second DC component extracting means and the first DC component extracting means are of the same architectures.

The comparator is used to generate a frequency locking signal responding to difference between DC components of the first amplified input signal and the second amplified input signal and then adding a dc offset current which comes from the hysteresis comparator. In the other word, The magnitude of the frequency locking signal from the comparing means is proportional to the difference of frequency of the first amplified input signal and the second amplified input signal and having a dc offset current which comes from the hysteresis comparator.

The phase detector is used to generate a phase locking signal responding to the phase difference of the reference input signal and the oscillating signal. The hysteresis comparator is used to provide an intentional DC (direct component) offset current to the comparator to avoid the DC offset current (voltage) which are caused by process or layout in the frequency detecting apparatus. The loop filter is used for generating a voltage level responding to the frequency locking signal and the phase locking signal. The voltage controlled oscillator is used for generating the oscillator signal responding to the voltage level form the loop filter. For the purpose of ensuring the reference input frequency equals the oscillator frequency, the hysteresis comparator detects the output signals of comparator and then generates a feedback signal into the comparator to ensure there exits a chance to make the reference input frequency equals the oscillator frequency. As the reference input frequency equals the oscillator frequency the phase detector will generate a phase tracking signal to make the voltage controlled oscillator to have the same frequency and constant phase relationship to the reference input signal.

The first frequency sensitive means and the second frequency sensitive means include resonant circuit or filter circuit. The frequency sensitive circuits mentioned above can be chosen from a group of circuits consisting of: RC, LC, RC-CR, LC-CL, RC-LC circuits. Besides the first DC component extracting means and the second DC component extracting means includes rectifier (half wave rectifier or full wave rectifier). The comparing means utilized in the preferred embodiment of the present invention is a comparator including a differential amplifier.

However, a method for detecting frequency and phase of reference input signal is also disclosed herein, and the method mentioned above includes the following steps. The first step is to amplify the reference input signal and the voltage controlled oscillator signal with a varying gain function responding to frequency of the reference input signal and the oscillating signal respectively. The magnitude of the varying gain function varies corresponding to the frequency of its corresponding input signal. Then extract the direct current component of the reference input signal and the oscillating signal.

Next, generate a frequency locking signal responding to difference of direct current component of the reference input signal and the oscillating signal and then adding a dc offset current which comes from the hysteresis comparator. The magnitude of the frequency locking signal is proportional to difference of the direct current components of the reference input signal and the oscillating signal and having a dc offset current which comes from the hysteresis comparator. In other words, the magnitude of the frequency locking signal is proportional to the difference of the frequency of the reference input signal and the oscillating signal and having a dc offset current which comes from the hysteresis comparator. The frequency locking signal and the phase locking signal then input to the loop filter to generate a voltage level. Finally, the voltage controlled oscillator generates an oscillator signal responding to the voltage level, and keeps the frequency of the reference input signal and the oscillator signal are the same and has a constant phase relationship in these two signals.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Since the traditional analog phase frequency detector needs large operational current and it has only one chance to lock the voltage controlled oscillator (VCO), there needs some improvement of the traditional analog phase frequency detector. The present invention proposes a kind of analog phase frequency detecting apparatus needing lower operational current and having better locking capability. Furthermore, the charging/discharging operation is not necessary in the analog phase frequency detecting apparatus according to the present invention, so the locking time is greatly reduced. In other words, the analog phase frequency detecting apparatus according to the present invention can quickly generate an oscillating signal that has the same frequency and constant phase relationship as the reference input signal.

Figure 1:
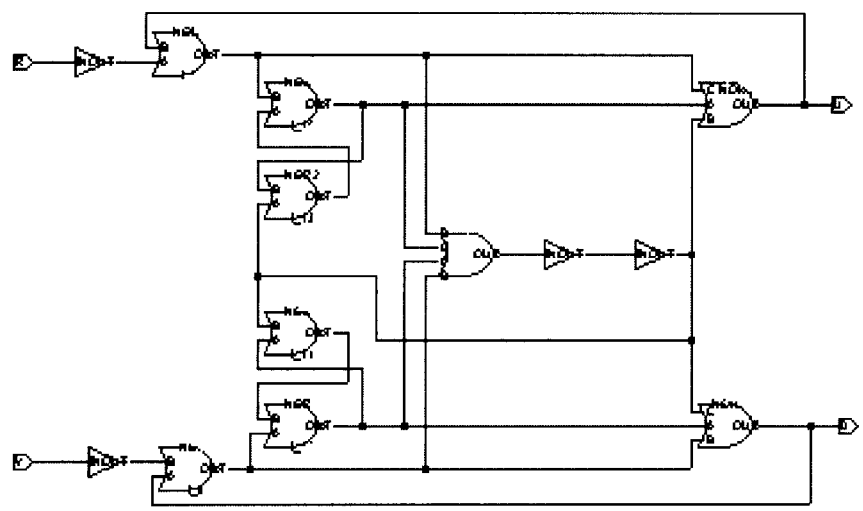
FIG. 1 illustrates the block diagram of the digital phase frequency detector.
Figure 2:
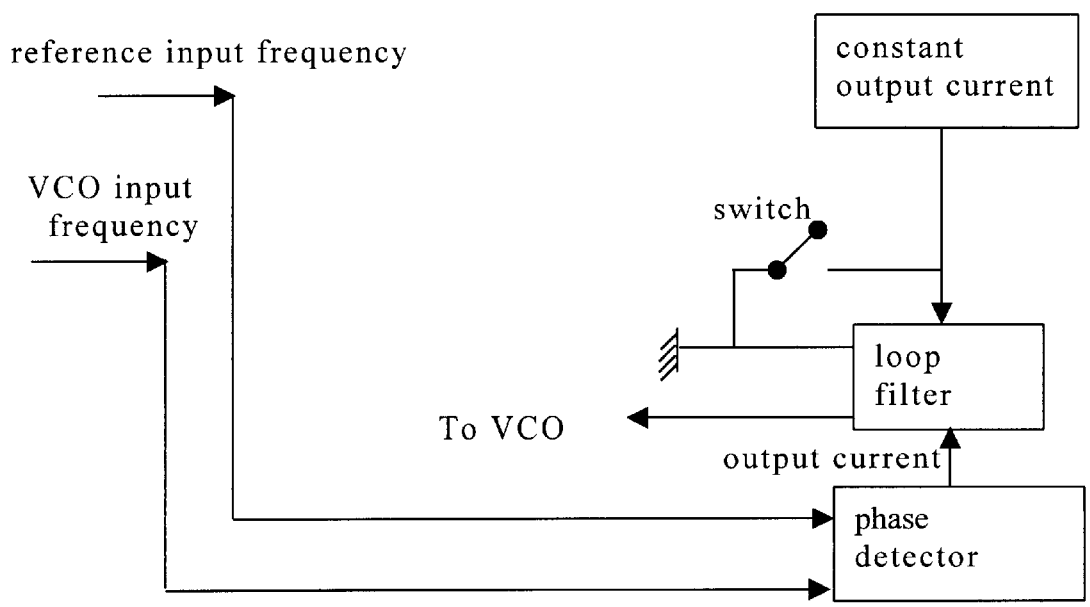
FIG. 2 illustrates the block diagram of the traditional analog phase frequency detector.
Figure 3:
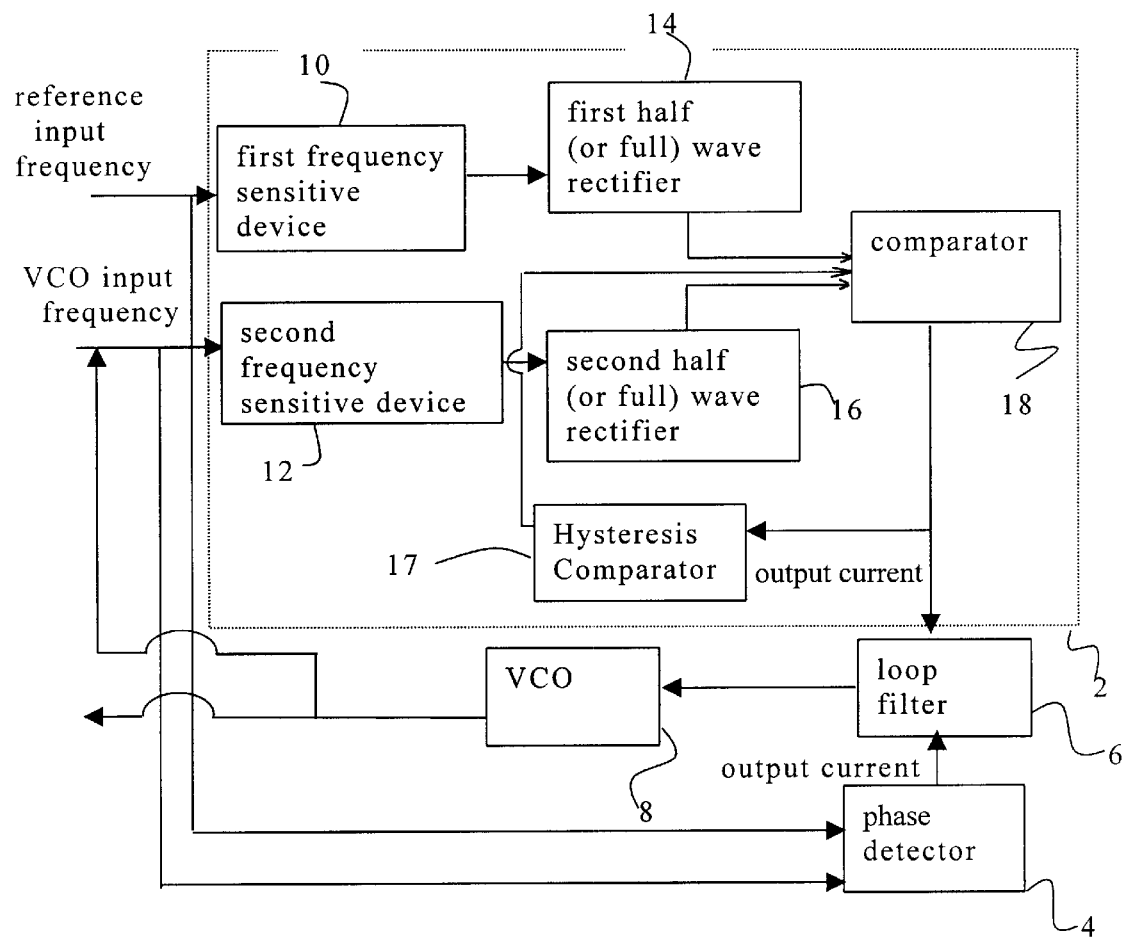
FIG. 3 illustrates the block diagram of the analog phase frequency detector according to one preferred embodiment of the present invention.

In order to briefly describe the present invention, the analog phase frequency detecting apparatus that can rapidly lock the frequency and phase of the input signal is taken as an example illustrating the preferred embodiment of the present invention. According to a preferred embodiment of the present invention, the analog phase frequency detecting apparatus as shown in FIG. 3 includes a frequency detecting means 2, a phase detecting means 4, a loop filter 6, and a voltage controlled oscillator (VCO) 8. Particularly, the frequency detecting means 2 being employed in the analog phase frequency detecting apparatus according to a preferred embodiment of the present invention can rapidly compare the frequency of the reference input signal and the oscillator signal from the VCO 8. In other words, the frequency detecting means 2 can rapidly lock the frequency of the VCO 8 at the frequency of the reference signal.

When the analog frequency detecting means 2 detects the frequency difference between the reference input signal and the voltage controlled oscillator 8, the analog frequency detecting means 2 output a voltage level (or current) to the loop filter 6 to make the frequency of voltage controlled oscillator 8 having chance to equal the frequency of reference input signal. As the frequency of reference input signal equals the frequency of voltage controlled oscillator 8, the phase detector 4 will continue the phase tracking process which makes the phase of the voltage controlled oscillator 8 has a constant phase relationship to the reference input signal. The principle of the foregoing operation is that the phase detecting means 4 locks the phase of the voltage controlled oscillator 8 according to the phase of the reference input signal after the frequency of reference input signal equals the frequency of voltage controlled oscillator 8.

The foregoing description is the procedure that the phase frequency detecting apparatus according to one preferred embodiment of the present invention locks the phase and frequency of the reference input signal. In addition, the traditional frequency detecting device can not compare the frequency of two optional input signals. The analog frequency detecting means 2 employed in the phase frequency detecting apparatus according to the present invention is improved to overcome the disadvantage mentioned above, and it can. be utilized to compare the frequency of two or more optional input signals. In order to briefly describe the frequency detecting means employed in the analog phase frequency detecting apparatus according to the preferred embodiment of the present invention. The analog frequency detecting means 2 that can compare two input signals (one is the reference input signal and the other is the output signal of the VCO) having varying frequency is illustrated as an example.

Figure 4:
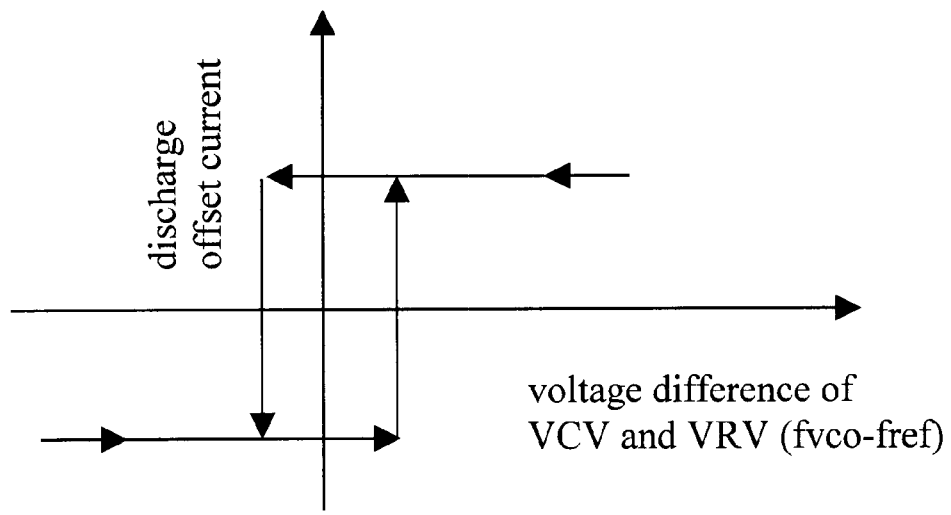
FIG. 4 illustrates transfer characteristic curve of the hysteresis comparator according to the analog phase frequency detecting apparatus proposed by one preferred embodiment of the present invention.

As shown in FIG. 3, the frequency detecting means 2 employed in the analog phase frequency detecting apparatus according to the preferred embodiment of the present invention includes a first frequency sensitive device 10, a second frequency sensitive device 12, a first half wave rectifier 14, a second half wave rectifier 16, a hysteresis comparator 17, and a comparator 18. The first frequency sensitive device 10 as well as the second frequency sensitive device 12 can be implemented by the resonant circuits or filter circuits in the preferred embodiment of the present invention. The transfer characteristic curve of hysteresis comparator 17 is shown in FIG. 4. In addition, the first half wave rectifier 14 and the second half wave rectifier 16 can be replaced with the full wave rectifier in the other preferred embodiment of the present invention.

According to the preferred embodiment of the present invention, the first frequency sensitive device 10 and the second frequency sensitive device 12 are of the same architecture, so the former has the same transfer curve as the latter. Assume the transfer curve of the first frequency sensitive device 10 is curve 20 (shown in FIG. 5) and the first central frequency of the first frequency sensitive device 10 is $Fc_1$, the second central frequency of the first frequency sensitive device 10 is $Fc_2$.

Figure 5:
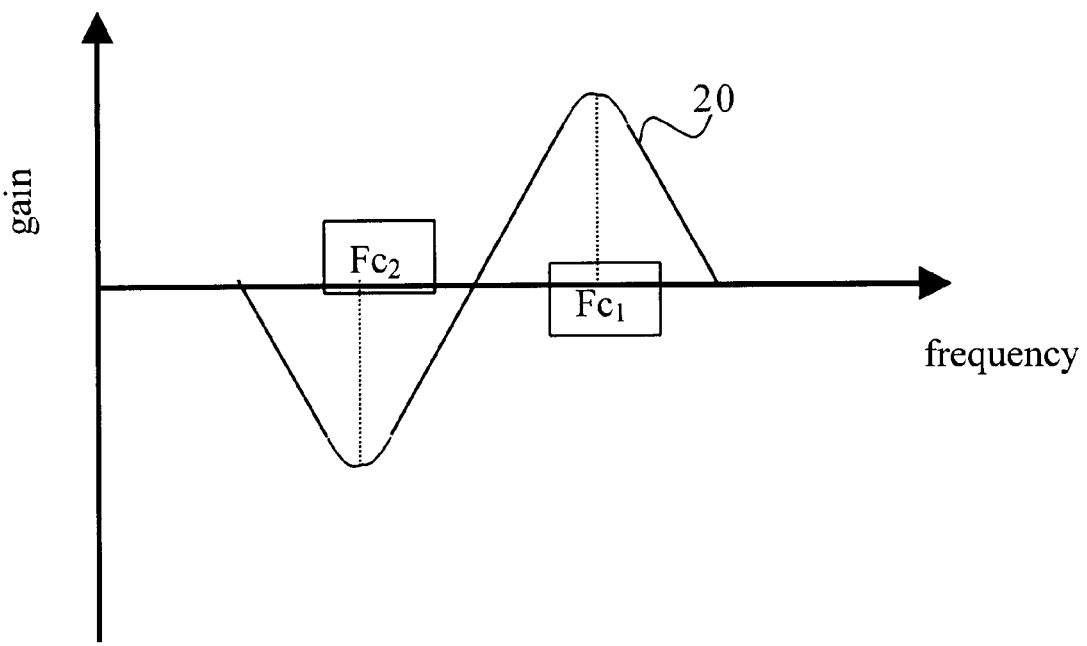
FIG. 5 illustrates the transfer characteristic curve of one example of the frequency sensitive device utilized in the analog frequency detecting device according to the analog phase frequency detecting apparatus proposed by one preferred embodiment of the present invention.

Because the second frequency sensitive device 12 has the same architecture as the first frequency sensitive device 10, the transfer curve of the second frequency sensitive device 12 is the same as curve 20 shown in FIG. 5. It is noted that the transfer curve of the first frequency sensitive device 10 and second frequency sensitive device 12 between the first central frequency and second central frequency is a monotonous (increase or decrease) curve. As an example of the analog frequency detecting means 10 employed in the analog phase frequency detecting apparatus according to the preferred embodiment of the present invention, the frequency range from the first central frequency $Fc_1$ to the second central frequency $Fc_2$ is defined as the working frequency of the analog frequency detecting means. The signal having the frequency within the working frequency can be properly processed.

As long as a circuit has the transfer curve that exhibits monotonous (increase or decrease) curve in a specific frequency range, the circuit can be used as the frequency sensitive device in the present invention, and the specific frequency range can be defined as the working frequency of the frequency sensitive device.

Turning to FIG. 3, the first frequency sensitive device 10 and the second frequency sensitive device 12 amplify the reference input signal S1(t) and the VCO input signal S2(t) respectively. Assume the frequency of the reference input signal is $f_{ref}$, and the frequency of the VCO input signal is $f_{VCO}$. The amplified signals from the first frequency sensitive device 10 and the second frequency sensitive device 12 are fed to the first half (or full) wave rectifier 14 and the second half (or full) wave rectifier 16 respectively. Then we can obtain the DC (direct current) component (such as VRV and VCV) of the amplified signals, and are fed to the comparator 18. Simultaneously, the hysteresis comparator 17 feeds a (charging) discharging current to the comparator 18 to compensate the DC offset component of the output signals from the frequency detecting means 2, i.e. let the DC offset problem be controlled by the circuit and doesn't dominated by process or layout.

The output of the comparator 18 is proportional to the voltage difference of signal VRV and VCV. Referring to FIG. 5, because the gain of the frequency sensitive device employed in the present invention varies in accordance with the frequency of the input signal, different input signals having different frequency result in output signals exhibiting different amplitudes. In addition, the rectifier extracts the DC component from the amplified input signal, which is fed from the frequency sensitive device. For the reason mentioned above, the amplitude of the amplified input signal from the frequency sensitive device is proportional to the frequency of the input signal.

Furthermore, the output of the comparator 18 is proportional to the difference of the DC component of the amplified input signals. For the reasons mentioned above, the output of the comparator 18 is proportional to the frequency difference of the input signals. It is noted that the output of the comparator is proportional to the frequency difference of the input signals, so the frequency difference between two optional signals can be detected (or measured) by the analog frequency detecting means in the analog phase frequency detecting apparatus according to the present invention.

The first frequency sensitive device 10 and the second frequency sensitive device 12 in the preferred embodiment of the present invention both can be implemented by resonant circuits or filter circuits such as RC-CR, LC-CL, RC-LC, RC, LC circuits. Wherein the character R stands for resistor, the character C stands for capacitance, and the character L stands for inductor. The first half (or full) wave rectifier 14 and the second half (or full) wave rectifier 16 in the preferred embodiment of the present invention can be replaced with any circuit that can extract DC component from an AC (alternative current) signal. In addition, the comparator 18 in the preferred embodiment of the present invention is implemented by using a differential amplifier, which can be replaced with a circuit that its output is proportional to the difference of its input signals.

Figure 6:
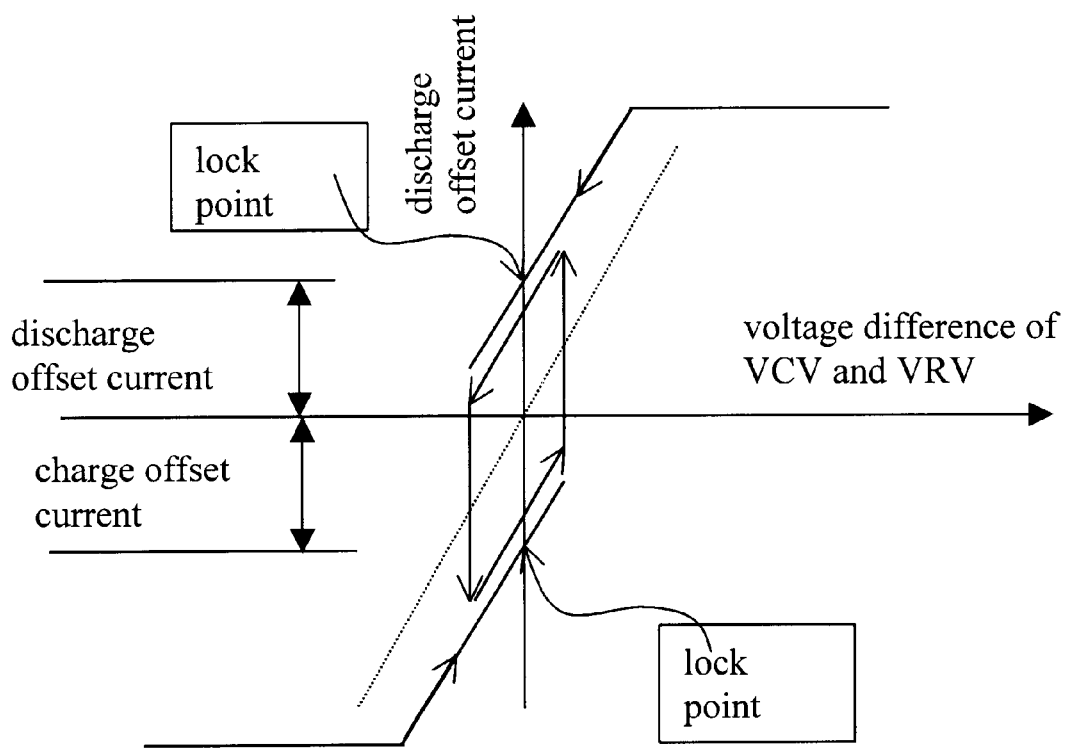
FIG. 6 illustrates the transfer characteristic curve of the comparator with the DC offset current which comes from the hysteresis comparator that are used in the analog phase frequency detecting apparatus proposed by one preferred embodiment of the present invention.
Figure 7:
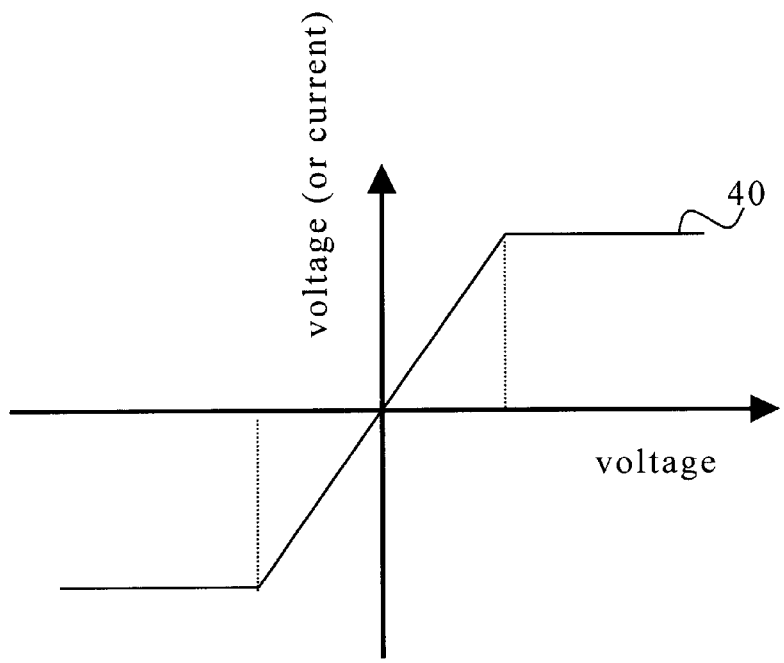
FIG. 7 illustrates the transfer characteristic curve of the comparator without the DC offset current which comes from the hysteresis comparator that are used in the analog phase frequency detecting apparatus proposed by one preferred embodiment of the present invention.

Besides, due to the hysteresis comparator employed in the present invention, the transfer curve of the analog phase frequency detecting apparatus proposed by one preferred embodiment of the present invention is illustrated in FIG. 6. According to FIG. 6, it is clear that the analog phase frequency detecting apparatus according to the present invention has many chances to lock the phase and frequency of the reference input signal.

According to the present invention, it is noted that the transfer curve of the frequency sensitive device at least includes a monotonous portion. Assume the frequency range corresponding to the monotonous portion of the transfer characteristic curve of the frequency sensitive device named as linear mapping frequency range is from $Fa_1$ to $Fa_2$, i.e., $[Fa_1, Fa_2]$. Besides, assume the working frequency range of the half wave rectifier (14 or 16) is from $Fa_3$ to $Fa_4$, i.e., $[Fa_3, Fa_4]$, thus the frequency $Fa_3$ is lower than the frequency $Fa_1$, and the frequency $Fa_4$ is higher than the frequency $Fa_2$.

Figure 8:
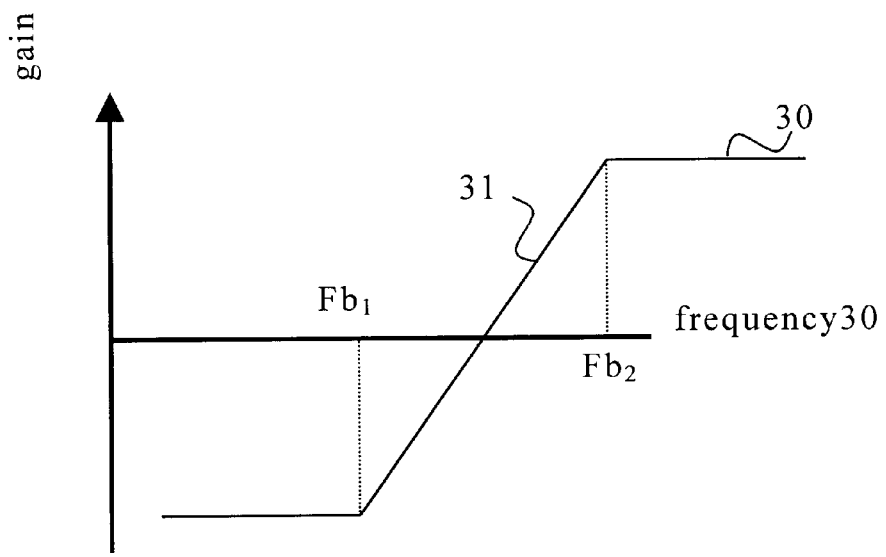
FIG. 8 illustrates the transfer characteristic curve of the other example of the frequency sensitive device utilized in the analog frequency detecting device according to the analog phase frequency detecting apparatus proposed by one preferred embodiment of the present invention.

As the other example, the transfer curve of the first frequency sensitive device 10 and the second frequency sensitive device 12 are curves 30 as shown in FIG. 8. The monotonous increase (or decrease) portion 31 of the transfer curve 30 is located within the frequency range from $Fb_1$ to $Fb_2$, i.e., $[Fb_1, Fb_2]$. In addition, assume the transfer curve of the first half wave rectifier 14 and the second half wave rectifier 16 have working frequency from $Fb_3$ to $Fb_4$, i.e., $[Fb_3, Fb_4]$. According to the preferred embodiment of the present invention, the working frequency range of the half wave rectifier includes the linear mapping frequency range responding to the monotonous increase (or decrease) portion of the transfer curve of the frequency sensitive device.

Figure 9:
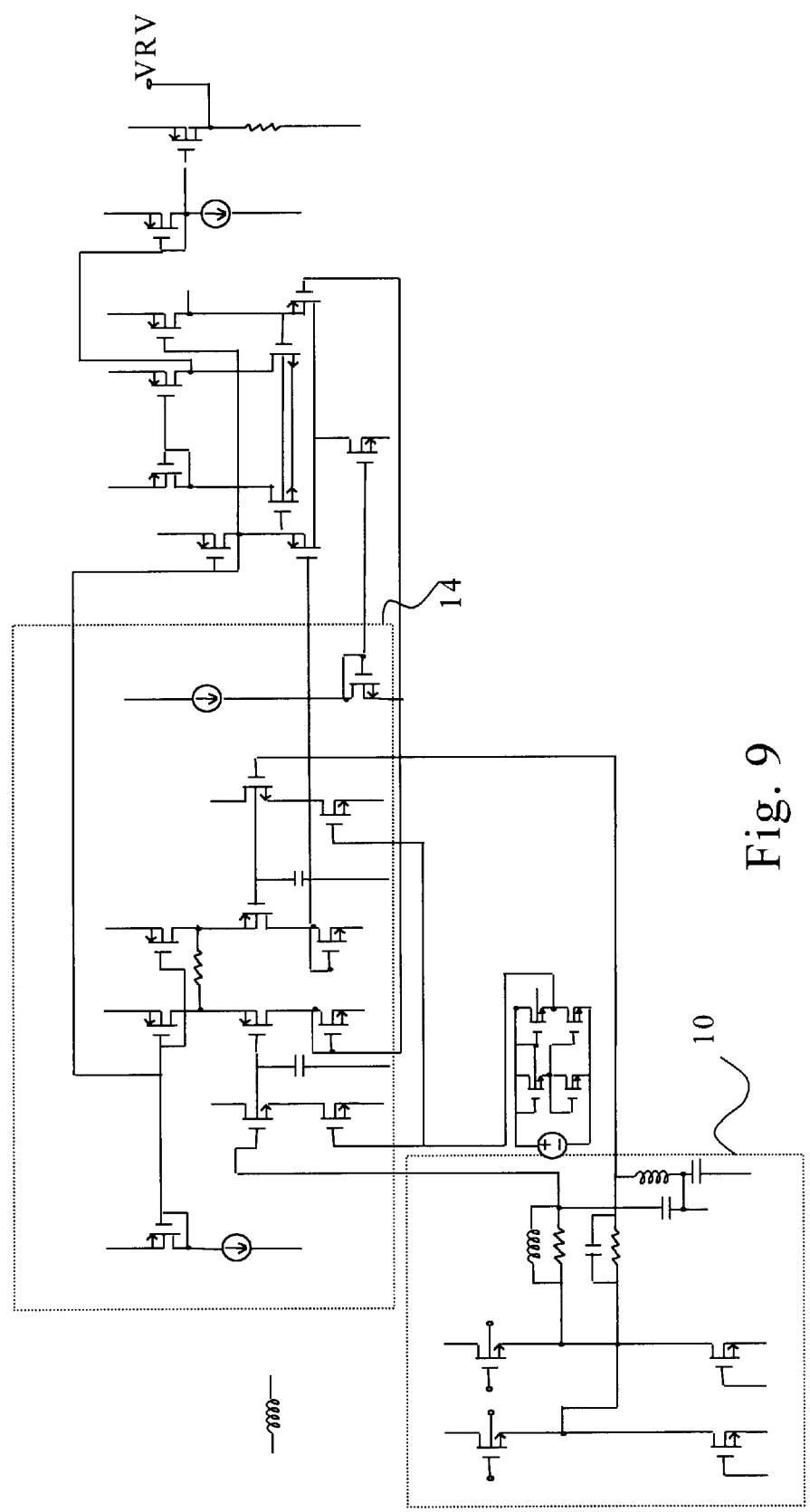
FIG. 9 illustrates the circuit diagram of the first frequency sensitive device serially connected with the first half wave rectifier according to one preferred embodiment of the present invention.
Figure 10:
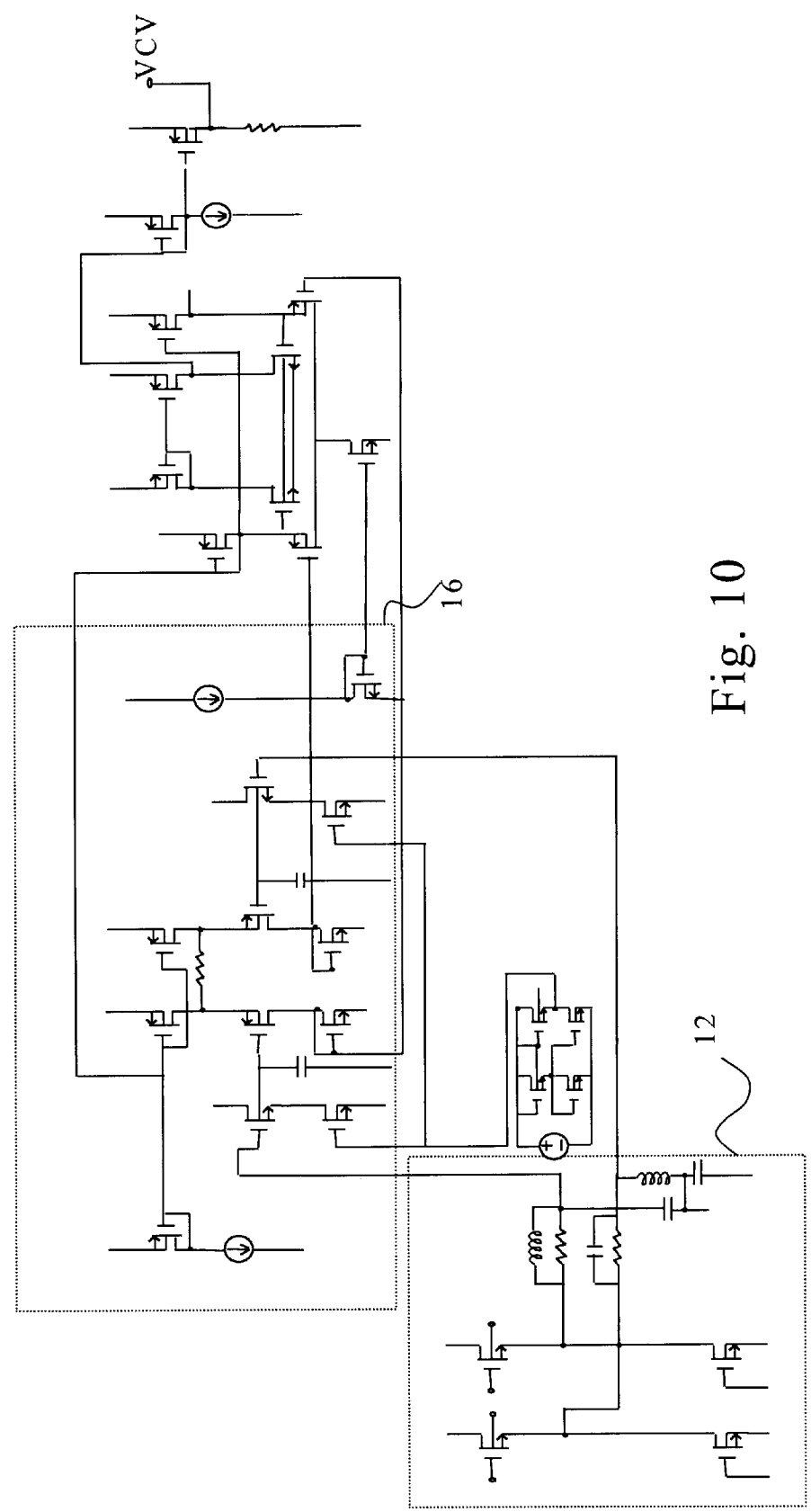
FIG. 10 illustrates the circuit diagram of the second frequency sensitive device serially connected with the second half wave rectifier according to one preferred embodiment of the present invention.

According to one preferred embodiment of the present invention, the circuit diagram of the first frequency sensitive device 10 and the serially connected first half wave rectifier 14 are detailed in FIG. 9. Besides the circuit diagram of the second frequency sensitive device 12 and the serially connected second half wave rectifier 16 according to one preferred embodiment of the present invention are illustrated in FIG. 10. Because the phase detecting means 4, the loop filter 6, and the hysteresis comparator 17 are widely used in the prior art, and they can be implemented by many traditional method, then the detail of them are omitted.

Figure 11:
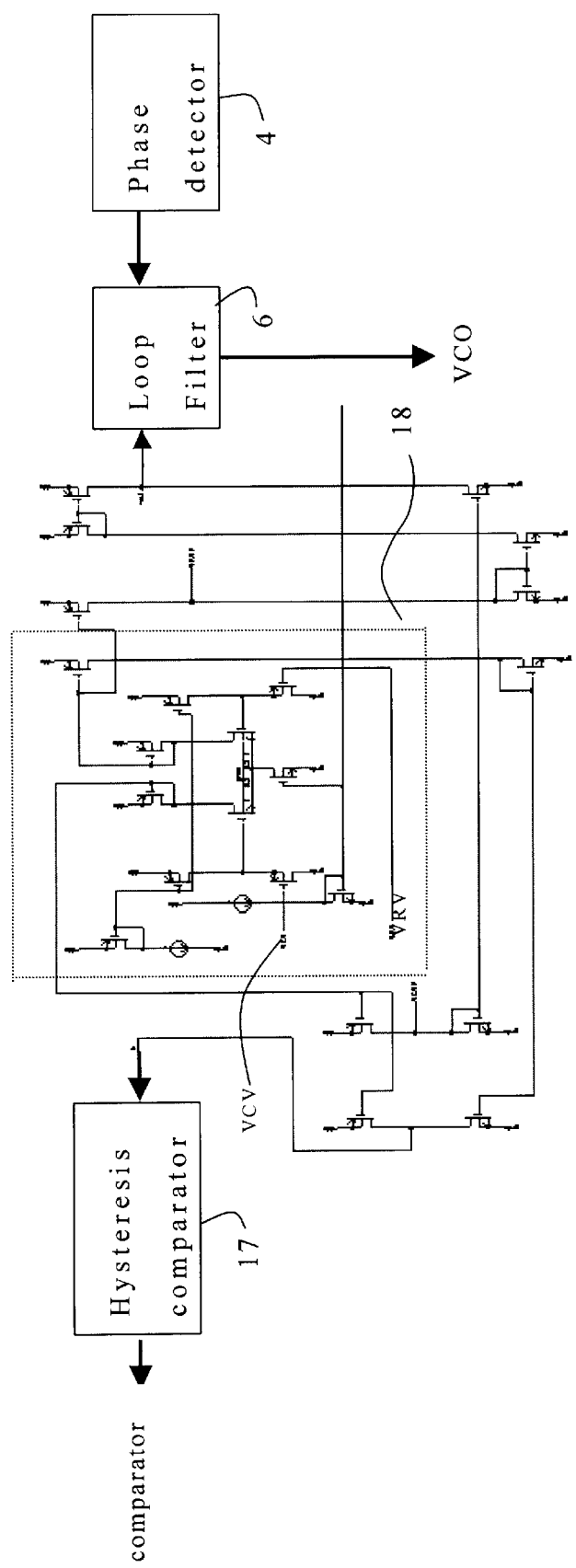
FIG. 11 illustrates the circuit diagram of the phase detector loop filter, hysteresis comparator, and comparator according to one preferred embodiment of the present invention.

According to one preferred embodiment of the present invention the phase detecting means 4, the loop filter 6, the hysteresis comparator 17 and the comparator 18 are illustrated in FIG. 11.

Though two frequency sensitive devices and half (or full) wave rectifiers are employed in the preferred embodiment of the present invention, the analog frequency detecting means employed in the analog phase frequency detecting apparatus according to the present invention can work properly with one or more frequency sensitive devices and half (or full) wave rectifiers. With two frequency sensitive devices and half (or full) wave rectifiers, the frequency of an input signal can be compared with the frequency of a reference signal. However, with more than two frequency sensitive devices and half (or full) wave rectifiers, more than one comparator can be used to compare the DC component of the amplified input signals. Similarly, these modifications will now suggest themselves to those skilled in the art.

The present invention proposes a method for comparing frequencies of input signals, according to the present invention, the method mentioned above includes the following steps. The first step is to amplify the input signals with a varying gain function responding to the frequency of each of the input signals.

The magnitude of the varying-gain-function varies corresponding to the frequency of each of the input signals. The second step is to extract the direct current component of each of the amplified input signals. Then generate an output signal responding to the difference of the direct current components of the amplified input signals. The magnitude of the output signal is proportional to the difference of the direct current components of the amplified input signals and pluses a DC offset current which comes from the hysteresis comparator. Such that we can control the DC offset component and don't let the process or layout dominate the DC offset problem.

As the reference input frequency equals the frequency of voltage controlled oscillator the phase detector will generate a phase tracking signal. Finally, the phase tracking signal and frequency tracking signal will be summed and then generate an output voltage through the loop filter. This output voltage is fed to the voltage controlled oscillator to generate a phase tracking oscillator signal.

According to the method proposed by the preferred embodiment of the present invention, the magnitude of the varying gain function changes corresponding to frequency. In addition, the varying gain function exhibits a monotonous curve within a linear mapping frequency range.

As will be understood by persons skilled in the art, the foregoing preferred embodiment of the present invention is illustrative of the present invention rather than limiting the present invention. Having described the invention in connection with a preferred embodiment, for example, if a various architecture of the frequency sensitive device is used in the preferred embodiment. As long as the amplitude of the output of the frequency sensitive device is proportional to the frequency of the input signal, the modification will now suggest itself to those skilled in the art. While the preferred embodiment of the invention has been illustrated and described, it will be appreciated that various changes can be made therein without departing from the spirit and scope of the invention.

What is claimed is:

1. An analog frequency detecting apparatus for locking a frequency and a phase of an oscillating signal to follow a frequency and a phase of a reference input signal, said frequency of said reference input signal being selected from a linear mapping frequency range, said oscillating signal being generated by a voltage control oscillator, said analog phase frequency detecting apparatus comprising:

a first frequency sensitive device for amplifying said reference input signal to generate a first amplified input signal using a varying gain function according to said frequency of said reference input signal, wherein a magnitude of said varying gain function varies according to said frequency of said reference input signal, and a transfer characteristic curve of said first frequency sensitive device comprises a monotonous portion within said linear mapping range;

a second frequency sensitive device for amplifying said oscillating signal to generate a second amplified signal using said varying gain function according to said frequency of said oscillating signal, wherein said second frequency sensitive device and said first frequency sensitive device have identical architectures, and a transfer characteristic curve of said second frequency sensitive device is identical to that of the first frequency sensitive device;

a first DC component extracting device connected to said first frequency sensitive device for extracting a direct current component of said first amplified input signal, wherein said linear mapping frequency range is within a working frequency range of said first DC component extracting device;

a second DC component extracting device connected to said second frequency sensitive device for extracting a direct current component of said second amplified input signal, wherein said linear mapping frequency range is within a working frequency range of said second DC component extracting device, and said second DC component extracting device and said first DC component extracting device have identical architectures;

a hysteresis comparator;

a comparing device connected to said first DC component extracting device, said second DC component extracting device, and said hysteresis comparator for generating a frequency locking signal responding to a difference between the direct current components of said first amplified input signal and said second amplified input signal, wherein said frequency locking signal is proportional to a difference between direct current components of said first amplified input signal and said second amplified input signal added with a DC offset current supplied by said hysteresis comparator, wherein a magnitude of said frequency locking signal from said comparing device is proportional to a difference of the frequency of said first amplified input signal and said second amplified input signal added with said DC offset current;

a phase detecting device for generating a phase locking signal responding to a phase difference of said reference input signal and said oscillating signal; and a loop filter connected to said phase detecting device and said comparing device for generating a voltage level responding to said frequency locking signal and said phase locking signal received from the phase detecting device and said comparing device, respectively;

whereby said voltage level of said loop filter is supplied to said voltage control oscillator to lock said oscillating signal.

2. Analog phase frequency detecting apparatus as claim 1, wherein said frequency sensitive devices comprise resonant circuit or filter circuit.

3. Analog phase frequency detecting apparatus as claim 2, wherein said frequency sensitive devices are chosen from a group consisting of: RC-CR, LC-CL, RC-LC, RC, LC circuits where R is resistor, L is inductor, and C is capacitor.

4. Analog phase frequency detecting apparatus as claim 1, wherein said DC component extracting means comprising rectifier.

5. Analog phase frequency detecting apparatus as claim 4, wherein said rectifier is chosen from a group consisting of: half wave rectifier and full wave rectifier.

6. Analog phase frequency detecting apparatus as claim 1, wherein said comparing means is a comparator comprising a differential amplifier.

7. A method for locking a frequency and a phase of an oscillating signal to follow a frequency and a phase of a reference input signal, said reference input signal being selected from a linear mapping frequency range, said oscillating signal being generated by a voltage control oscillator, said method comprising the steps of:

amplifying said reference input signal by a first frequency sensitive device having a gain function of frequency, wherein said first frequency sensitive device amplifies said reference input signal with gains according to said frequency of said reference input signal using said gain function, and a transfer characteristic curve of said gain function has a monotonous portion within said linear mapping frequency range;

amplifying said oscillating signal by a second frequency sensitive device which has said gain function of frequency, wherein said second frequency sensitive device amplifies said oscillating signal with gains according to said frequency of said oscillating frequency using said gain function;

extracting direct current components of said reference input signal and said oscillating signal;

generating a DC offset current by a hysteresis comparator;

generating a frequency locking signal proportional to a difference of the direct current components of said reference input signal and said oscillating signal added with said DC offset current supplied by said hysteresis comparator;

generating a phase locking signal by comparing a phase of said reference input signal and said oscillating signal;

generating a voltage level responding to said frequency locking signal and said phase locking signal; and generating said oscillating output signal responding to said voltage level.

* * * * *